United States Patent
Senda et al.

(10) Patent No.: US 8,252,700 B2
(45) Date of Patent: Aug. 28, 2012

(54) METHOD OF HEAT TREATING SILICON WAFER

(75) Inventors: Takeshi Senda, Niigata (JP); Hiromichi Isogai, Niigata (JP); Eiji Toyoda, Niigata (JP); Kumiko Murayama, Niigata (JP); Koji Araki, Niigata (JP); Tatsuhiko Aoki, Niigata (JP); Haruo Sudo, Niigata (JP); Koji Izunome, Niigata (JP); Susumu Maeda, Kanagawa (JP); Kazuhiko Kashima, Kanagawa (JP)

(73) Assignee: Covalent Materials Corporation, Tokyo (JP)

( * ) Notice: Subject to any disclaimer, the term of this patent is extended or adjusted under 35 U.S.C. 154(b) by 0 days.

(21) Appl. No.: 12/656,232

(22) Filed: Jan. 21, 2010

(65) Prior Publication Data
US 2010/0197146 A1 Aug. 5, 2010

(30) Foreign Application Priority Data

Jan. 30, 2009 (JP) .............. P2009-019268
Jan. 30, 2009 (JP) .............. P2009-019269

(51) Int. Cl.
H01L 21/31 (2006.01)
H01L 21/469 (2006.01)

(52) U.S. Cl. .............. 438/770; 257/E21.214

(58) Field of Classification Search .......... 438/770; 257/E21.214
See application file for complete search history.

(56) References Cited

U.S. PATENT DOCUMENTS

| 6,143,071 | A | 11/2000 | Aihara et al. | |
| 2006/0027159 | A1* | 2/2006 | Shibayama et al. | 117/19 |
| 2006/0189169 | A1 | 8/2006 | Adachi et al. | |
| 2008/0124929 | A1* | 5/2008 | Okuda et al. | 438/692 |
| 2010/0038757 | A1* | 2/2010 | Isogai et al. | 257/655 |
| 2010/0120223 | A1* | 5/2010 | Kobayashi et al. | 438/458 |

FOREIGN PATENT DOCUMENTS

| JP | 2000-31150 | 1/2000 |
| JP | 2006-261632 | 9/2006 |

* cited by examiner

Primary Examiner — Alexander Ghyka
Assistant Examiner — Stanetta Isaac
(74) Attorney, Agent, or Firm — McGinn IP Law Group, PLLC

(57) ABSTRACT

In a method of heat treating a wafer obtained by slicing a silicon single crystal ingot manufactured by the Czochralski method, a rapid heating/cooling heat treatment is carried out by setting a holding time at an ultimate temperature of 1200° C. or more and a melting point of silicon or less to be equal to or longer than one second and to be equal to or shorter than 60 seconds in a mixed gas atmosphere containing oxygen having an oxygen partial pressure of 1.0% or more and 20% or less and argon, and an oxide film having a thickness of 9.1 nm or less or 24.3 nm or more is thus formed on a surface of the silicon wafer.

8 Claims, 8 Drawing Sheets

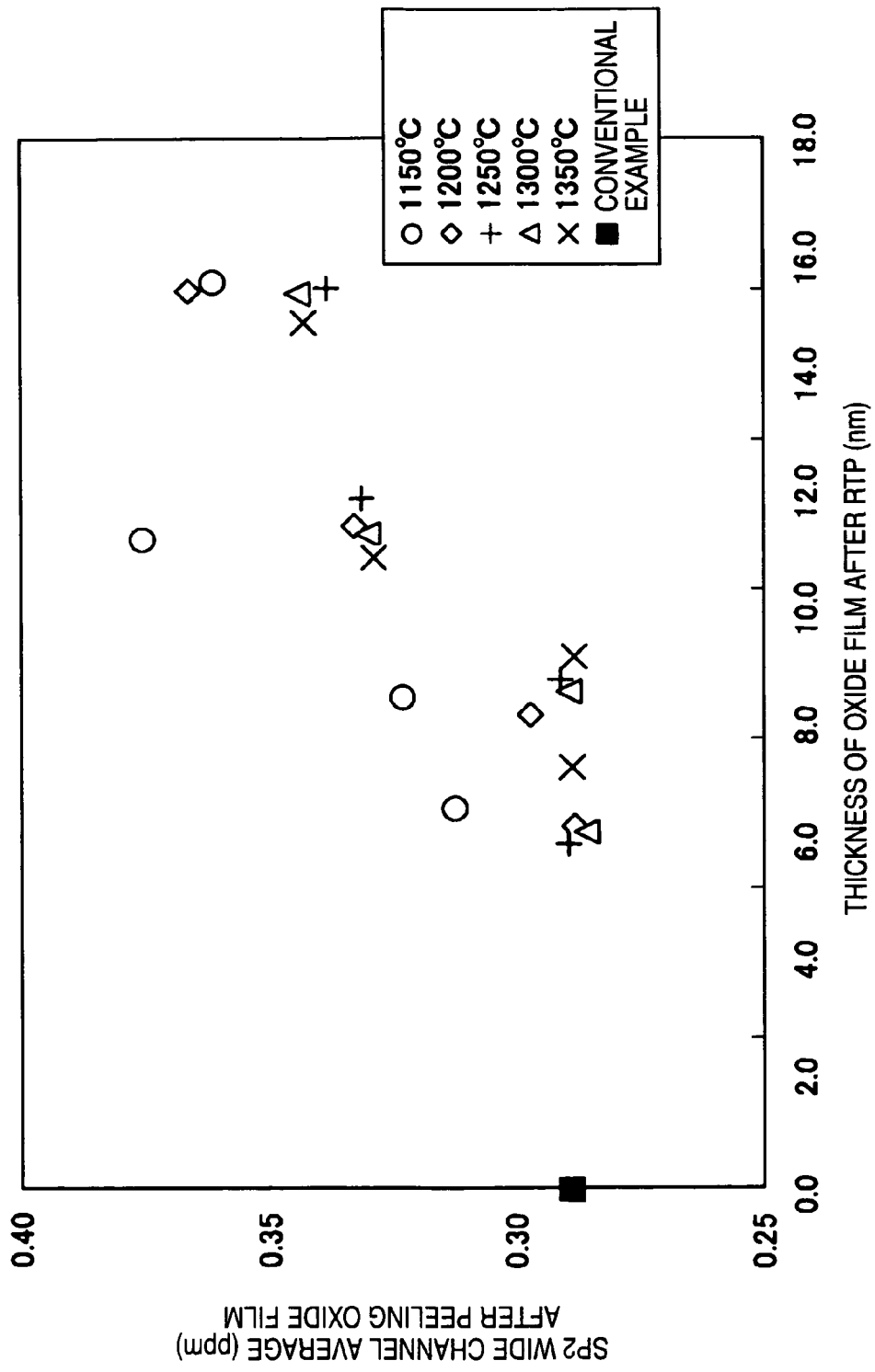

_US 8,252,700 B2_

METHOD OF HEAT TREATING SILICON WAFER

This application claims priorities from Japanese Patent Application No. 2009-019268, filed on Jan. 30, 2009, and Japanese Patent Application No. 2009-019269, filed on Jan. 30, 2009, the entire contents of which are hereby incorporated by reference.

FIELD OF THE INVENTION

The present invention relates to a heat treating method to be carried out for applying, to a semiconductor device, a silicon wafer obtained by slicing a silicon single crystal ingot manufactured by the Czochralski method (which will be hereinafter referred to as the CZ method).

DESCRIPTION OF RELATED ART

Referring to a silicon wafer (which will be hereinafter referred to as a wafer) to be used as a semiconductor device forming substrate, a silicon wafer subjected to mirror polishing is generally heat treated (annealed) in a predetermined environment in order to enhance a yield in a semiconductor device process.

As the related-art heat treating technique, for instance, Japanese Patent Application Publication No. JP-A-2006-261632 discloses a method of carrying out a heat treatment for 1 to 20 hours at a temperature of 1250 to 1380° C. in a gas atmosphere containing 5% of oxygen or more. Japanese Patent Application Publication No. JP-A-2000-31150 discloses a method of carrying out a heat treatment by setting a maximum holding temperature to be equal to or higher than 1125° C. and to be equal to or lower than a melting point of silicon in an atmosphere containing 100% of nitrogen or 100% of oxygen, or a mixing atmosphere of the oxygen and the nitrogen and setting a holding time to be equal to or greater than five seconds, and then performing quick cooling at a cooling speed of 8° C./second or more from the maximum holding temperature.

However, a silicon wafer manufactured by the method described in JP-A-2006-261632 has a problem in that a dislocation is apt to occur on a surface of the wafer in a heat treatment in a semiconductor device process.

Referring to a silicon wafer manufactured by the method described in JP-A-2000-31150, moreover, a rapid heating/cooling heat treatment is carried out in an atmosphere containing oxygen. Therefore, an oxide film is formed on a surface of the wafer subjected to the heat treatment, that is, a device forming surface subjected to mirror polishing. However, there is a problem in that a roughness of the surface of the wafer is deteriorated depending on the conditions.

Therefore, the problems cause a yield in the semiconductor device process to be reduced.

SUMMARY OF INVENTION

Illustrative aspects of the present invention provide a method of heat treating a silicon wafer which can suppress an occurrence of a dislocation and a deterioration in a roughness of a surface of the wafer in a semiconductor device process.

According to an aspect of the invention, a method of heat treating a silicon wafer, is provided with: carrying out a rapid heating/cooling heat treatment for forming an oxide film having a thickness of 9.1 nm or less or 24.3 nm or more on a surface of the silicon wafer in an oxygen containing atmosphere.

By carrying out the heat treatment, it is possible to suppress an occurrence of a dislocation and a deterioration in a roughness of the surface of the wafer in a semiconductor device process.

Other aspects and advantages of the invention will be apparent from the following description, the drawings and the claims.

BRIEF DESCRIPTION OF THE DRAWINGS

FIG. 9 is a graph showing a relationship between the thickness of the oxide film and the wafer in-plane average value of the Haze of SP2 at each ultimate temperature T1 in the test 2-1.

DETAILED DESCRIPTION OF EXEMPLARY EMBODIMENTS

First Embodiment

Figure 1:
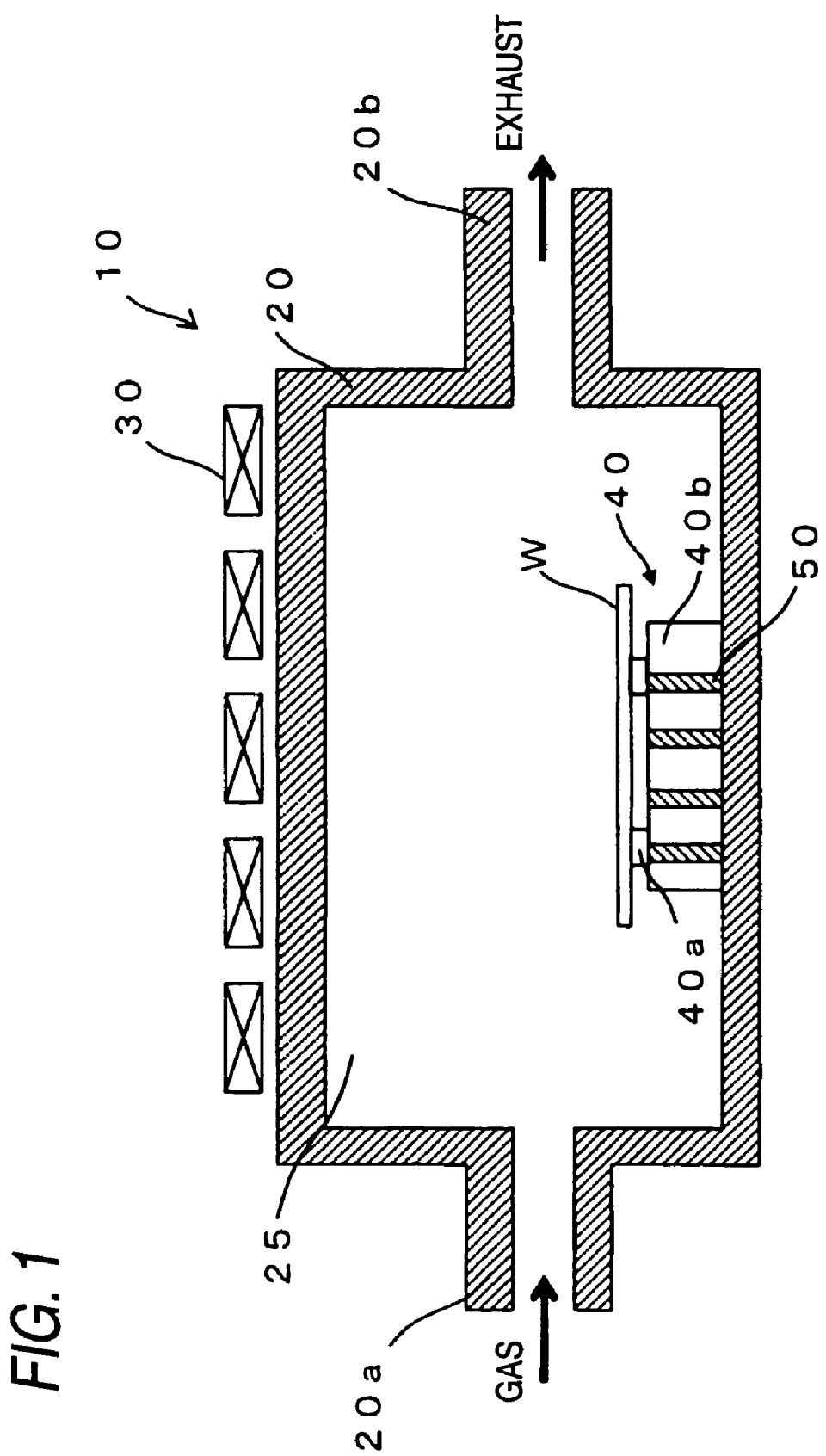
FIG. 1 is a sectional view showing an outline of an example of a rapid heating/cooling thermal process apparatus to be used in a method of heat treating a silicon wafer according to the invention.

A first embodiment according to the invention will be described below in more detail with reference to the drawings.

In a method of heat treating a silicon wafer according to the first embodiment, a rapid heating/cooling heat treatment is carried out over a wafer obtained by slicing a silicon single crystal ingot manufactured by the CZ method. The invention is characterized in that the rapid heating/cooling heat treatment is carried out at an ultimate temperature which is equal to or higher than 1300° C. and is equal to or lower than a melting point of silicon in an oxygen containing atmosphere and an oxide film having a thickness of 24.3 nm or more is thus formed on a surface of the wafer.

In the related-art heat treating method described above, a dislocation occurs as follows. A trench is formed in a semiconductor device process so that a stress is applied to an inner part of a wafer. Consequently, the dislocation occurs in the wafer. In a subsequent heat treatment, the dislocation is extended to a surface of the wafer.

In other words, in a heat treatment to be carried out after mirror polishing, it can be supposed that oxygen in the wafer is excessively diffused outward, an oxygen concentration of a surface layer of the wafer is reduced and a pinning force of the oxygen against the dislocation is reduced, and the dislocation occurring in the wafer is thus apt to be extended to the surface of the wafer.

On the other hand, in the invention, the rapid heating/cooling heat treatment is carried out over the silicon wafer. Consequently, a solubility limit oxygen concentration corresponding to the temperature is diffused inward from the atmosphere to an inner part of the wafer, and furthermore, a time required for a fall in a temperature is short. Therefore, it is possible to suppress the outward diffusion of the oxygen in the wafer diffused inward. For this reason, it is possible to suppress an increase or reduction in the oxygen concentration in the surface layer of the wafer. In other words, it is possible to suppress a reduction in the pinning force of the oxygen against the dislocation. Consequently, it is possible to prevent the dislocation occurring in the wafer from being extended to the surface.

Moreover, the ultimate temperature and the thickness of the oxide film are controlled into the range to carry out the rapid heating/cooling heat treatment. Consequently, it is also possible to suppress a deterioration in a roughness of the surface of the wafer due to the formation of the oxide film in the heat treatment.

In the method of heat treating a silicon wafer according to the invention, the rapid heating/cooling heat treatment is carried out over a wafer obtained by slicing a silicon single crystal ingot manufactured by the CZ method.

The silicon single crystal ingot can be manufactured by the CZ method through a well-known process. More specifically, polysilicon filled in a quartz crucible is heated into a silicon melting solution, and a seed crystal is caused to come in contact with a liquid level of the silicon melting solution and the seed crystal and the quartz crucible are rotated, and at the same time, the seed crystal is pulled up and a diameter is increased into a desirable diameter to form a direct drum portion, and the seed crystal is then removed from the silicon melting solution to grow a silicon single crystal ingot.

Next, the silicon single crystal ingot thus obtained is processed into a silicon wafer by a well-known process. More specifically, the silicon single crystal ingot is sliced to take a shape of a wafer by means of an inside blade or a wire saw and a processing such as chamfering of an outer peripheral portion, lapping, etching or mirror polishing is then carried out.

The rapid heating/cooling heat treatment is carried out over the silicon wafer thus obtained and subjected to the mirror polishing on a condition that an ultimate temperature is equal to or higher than 1300° C. and is equal to or lower than a melting point of silicon in an oxygen containing atmosphere by using a rapid heating/cooling thermal process apparatus (which will be hereinafter referred to as an RTP apparatus) so that an oxide film having a thickness of 24.3 nm or more is formed on a surface of the wafer.

FIG. 1 shows an outline of an example of the RTP apparatus to be used in a method of heat treating a silicon wafer according to the invention.

An RTP apparatus 10 shown in FIG. 1 includes a reaction tube 20 having an atmospheric gas inlet 20a and an atmospheric gas outlet 20b, a plurality of lamps 30 disposed on the reaction tube 20 apart from each other, and a wafer support portion 40 for supporting a wafer W in a reaction space 25 in the reaction tube 20.

The wafer support portion 40 has a circular susceptor 40a for directly supporting the wafer W and a stage 40b for supporting the susceptor 40a.

For example, the reaction tube 20 and the stage 40b are formed of quarts and the susceptor 40a is formed of silicon. Furthermore, the lamp 30 is constituted by a halogen lamp, for example.

A rapid heating/cooling heat treatment for the wafer W using the RTP apparatus 10 shown in FIG. 1 is carried out by introducing the wafer W into the reaction space 25 through a wafer inlet (not shown) provided on the reaction tube 20, supporting the wafer W on the susceptor 40a of the wafer support portion 40, introducing, from the atmospheric gas inlet 20a, an atmospheric gas which will be described below, and causing the lamp 30 to irradiate a light to the surface of the wafer W.

Referring to a temperature control in the reaction space 25, an average temperature on a large number of points (for example, nine points) is measured in a radial direction of the wafer W in a back face of the wafer W by means of a plurality of radiation thermometers 50 embedded in the stage 40b of the wafer support portion 40 and individual outputs of the lamps 30 are controlled by control means (not shown) based on each measured temperature.

In the rapid heating/cooling heat treatment, in the case in which the thickness of the oxide film formed on the surface of the wafer is smaller than 24.3 nm and the case in which the ultimate temperature in the rapid heating/cooling heat treatment is lower than 1300° C. even if the thickness of the oxide film is equal to or greater than 24.3 nm, it is hard to suppress a deterioration in a roughness of the surface of the wafer. On the other hand, in the case in which the ultimate temperature exceeds the melting point of the silicon, a silicon wafer to be heat treated is molten.

From a viewpoint of a lifetime of the RTP apparatus, moreover, it is more preferable that the ultimate temperature should be equal to or higher than 1300° C. and should be equal to or lower than 1380° C.

From a viewpoint of a removal of the formed oxide film with a high productivity after the rapid heating/cooling heat treatment, it is preferable that an upper limit of the thickness of the oxide film should be equal to or smaller than 100 nm.

Figure 2:
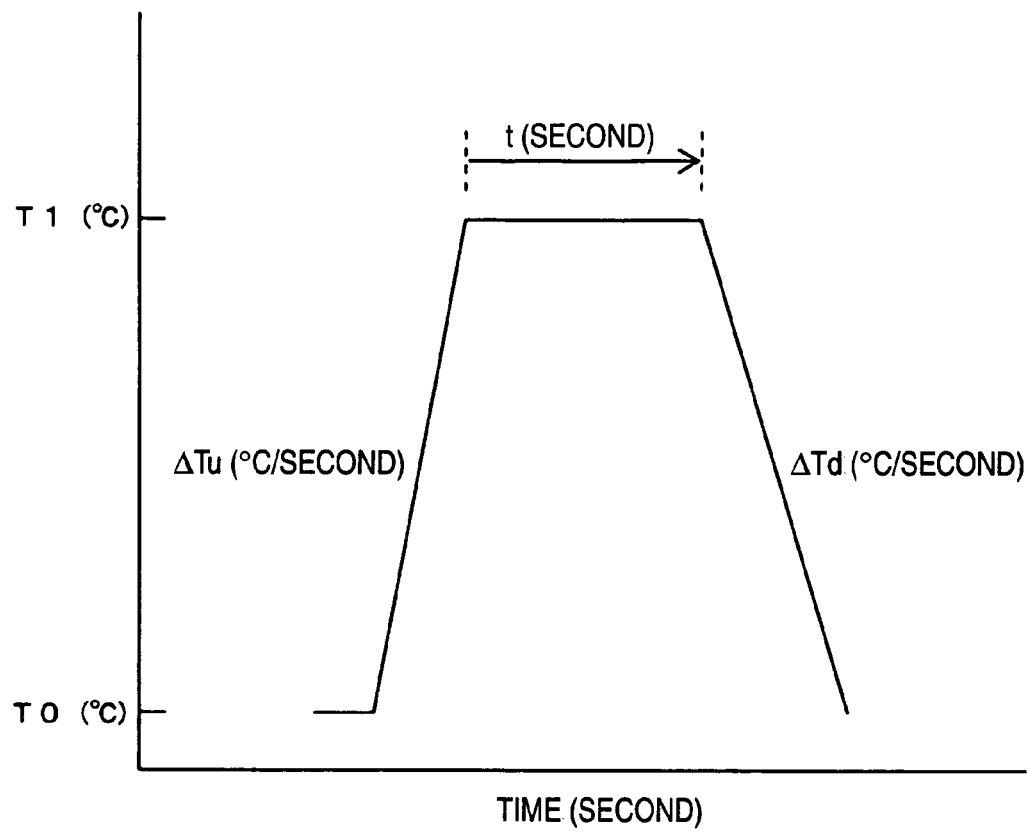
FIG. 2 is a schematic chart showing a heat treating sequence in a rapid heating/cooling heat treatment according to the invention.

FIG. 2 schematically shows a relationship between a temperature and a time in a heat treating sequence in the rapid heating/cooling heat treatment.

As shown in FIG. 2, first of all, a silicon wafer subjected to mirror polishing is held at a temperature T0 (for example, 500° C.) and is quickly heated up to an ultimate temperature T1 (° C.) at a temperature rising speed ΔTu (° C./second) in an oxygen containing atmosphere, and is held for a predetermined time t (second) and is then cooled quickly from the ultimate temperature T1 (° C.) to the temperature T0 (° C.) at a temperature falling speed ΔTd (° C./second).

It is preferable that an oxygen partial pressure in the oxygen containing atmosphere should be equal to or higher than 1.0% and should be equal to or lower than 20%.

If the oxygen partial pressure is lower than 1.0%, it is hard to control a thickness of an oxide film into the range, and furthermore, an amount of inward diffusion of oxygen in the atmosphere into the wafer is decreased. As a result, a pinning force of the oxygen is reduced so that it is difficult to suppress an occurrence of a dislocation in a semiconductor device process.

On the other hand, if the oxygen partial pressure exceeds 20%, an oxide film to be formed is over-thickened because the oxygen partial pressure is excessively high. Therefore, it is hard to remove the oxide film with a high productivity.

It is preferable that a gas other than an oxygen gas in the oxygen containing atmosphere should be an inert gas.

If a nitrogen gas is used as the gas other than the oxygen gas, a nitride film is formed on a surface of the wafer in the rapid heating/cooling heat treatment. In order to remove the nitride film, it is necessary to newly add an etching step so that the number of the steps is increased, which is not preferable.

If a hydrogen gas is used as the gas other than the oxygen gas, moreover, there is a possibility that a mixed gas of oxygen and hydrogen might cause an explosion, which is not preferable.

For the inert gas, particularly, it is preferable to use an argon gas. In case of the argon gas, it is possible to carry out the rapid heating/cooling heat treatment without causing a formation of another film such as the nitride film or a chemical reaction.

Both the temperature rising speed $\Delta Tu$ and the temperature falling speed $\Delta Td$ may be equal to or higher than 10° C./second and may be equal to or lower than 150° C./second.

In the case in which the temperature rising speed $\Delta Tu$ or the temperature falling speed $\Delta Td$ is lower than 10° C./second, a productivity is deteriorated.

On the other hand, in the case in which the temperature rising speed $\Delta Tu$ or the temperature falling speed $\Delta Td$ exceeds 150° C./second, the silicon wafer is not resistant to an excessively rapid change in a temperature so that a slip occurs.

The ultimate temperature $T1$ is equal to or higher than 1300° C. and is equal to or lower than the melting point of the silicon, and is preferably equal to or higher than 1300° C. and is equal to or lower than 1380° C. as described above.

In case of the rapid heating/cooling heat treatment using the RTP apparatus shown in FIG. 1, it is assumed that the ultimate temperature $T1$ is set to be an average temperature on a large number of points (for example, nine points) in a radial direction of the wafer W in a back face of the wafer W.

The holding time t at the ultimate temperature $T1$ may be equal to or longer than one second and may be equal to or shorter than 60 seconds.

If the holding time t is shorter than one second, it is hard to achieve a reduction in a Grown-in defect and an enhancement in a Bulk Micro Defect (BMD) density which are original objects of the rapid heating/cooling heat treatment.

On the other hand, if the holding time t exceeds 60 seconds, a productivity is deteriorated and the outward diffusion of the oxygen in the wafer is increased, which is not preferable.

EXAMPLE 1

More specific description will be given to the first embodiment according to the invention based on an example 1 and the invention is not restricted to the following example 1.
(Test 1-1) Relationship Among Ultimate Temperature, Thickness of Oxide Film and Surface Roughness A silicon wafer (a diameter of 300 mm, a thickness of 775 mm and an oxygen concentration of $1.3 \times 10^{18}$ atoms/cc) obtained by slicing a silicon single crystal ingot manufactured by the CZ method and having both sides subjected to mirror polishing was introduced into the RTP apparatus shown in FIG. 1, and an ultimate temperature $T1$ and a holding time t were varied in an oxygen 100% atmosphere (a flow rate of 20 slm) at a temperature $T0$ of 500° C., and a temperature rising speed $\Delta Tu$ and a temperature falling speed $\Delta Td$ of 50° C./second so that a rapid heating/cooling heat treatment was carried out in the heat treating sequence shown in FIG. 2. Consequently, there was obtained an anneal wafer in which a thickness of an oxide film formed on a surface of the wafer is varied.

Figure 3:
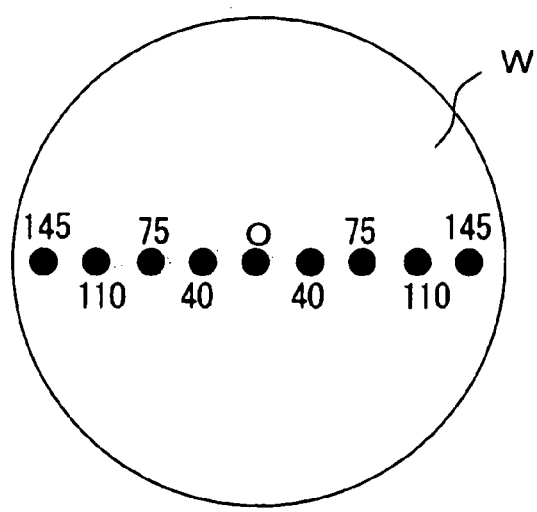
FIG. 3 is a view showing a measuring point of a thickness of an oxide film on a surface of a wafer in a test 1-1.

The thickness of the oxide film formed on the surface of each anneal wafer thus obtained was measured through AutoEL III (manufactured by Rudolph Research Co., Ltd.) by an ellipsometry method. The measurement was carried out on nine points in total which include a wafer center O (a distance of 0 mm from a center) and two points for each of positions having distances of 40 mm, 75 mm, 110 mm and 145 mm in both directions from the center of the wafer to a circumference of the wafer as shown in FIG. 3. Their average value was set to be the thickness of the film. Numeric values in FIG. 3 represent the distance from the center of the wafer.

Moreover, the oxide film was removed by fluoric acid cleaning and a wafer in-plane average value of a surface roughness (Haze) was then measured by a laser beam scattering type particle counter (SP1 and SP2 manufactured by KLA-Tencor Co., Ltd.).

For comparison, as the conventional example, the rapid heating/cooling heat treatment was not carried out over the same silicon wafer as described above but a heat treatment was performed by using a well-known vertical heat treating furnace in an argon 100% atmosphere at a temperature $T0$ of 500° C., a temperature rising speed $\Delta Tu$ and a temperature falling speed $\Delta Td$ of 3° C./minute, an ultimate temperature $T1$ of 1200° C. and a holding time t of one hour at the ultimate temperature $T1$, and a thickness of an oxide film and a wafer in-plane average value of the Haze were measured in the same manner as described above.

Table 1 shows a result of the measurement for the thickness of the oxide film and the wafer in-plane average value of the Haze at each ultimate temperature $T1$.

Figure 4:
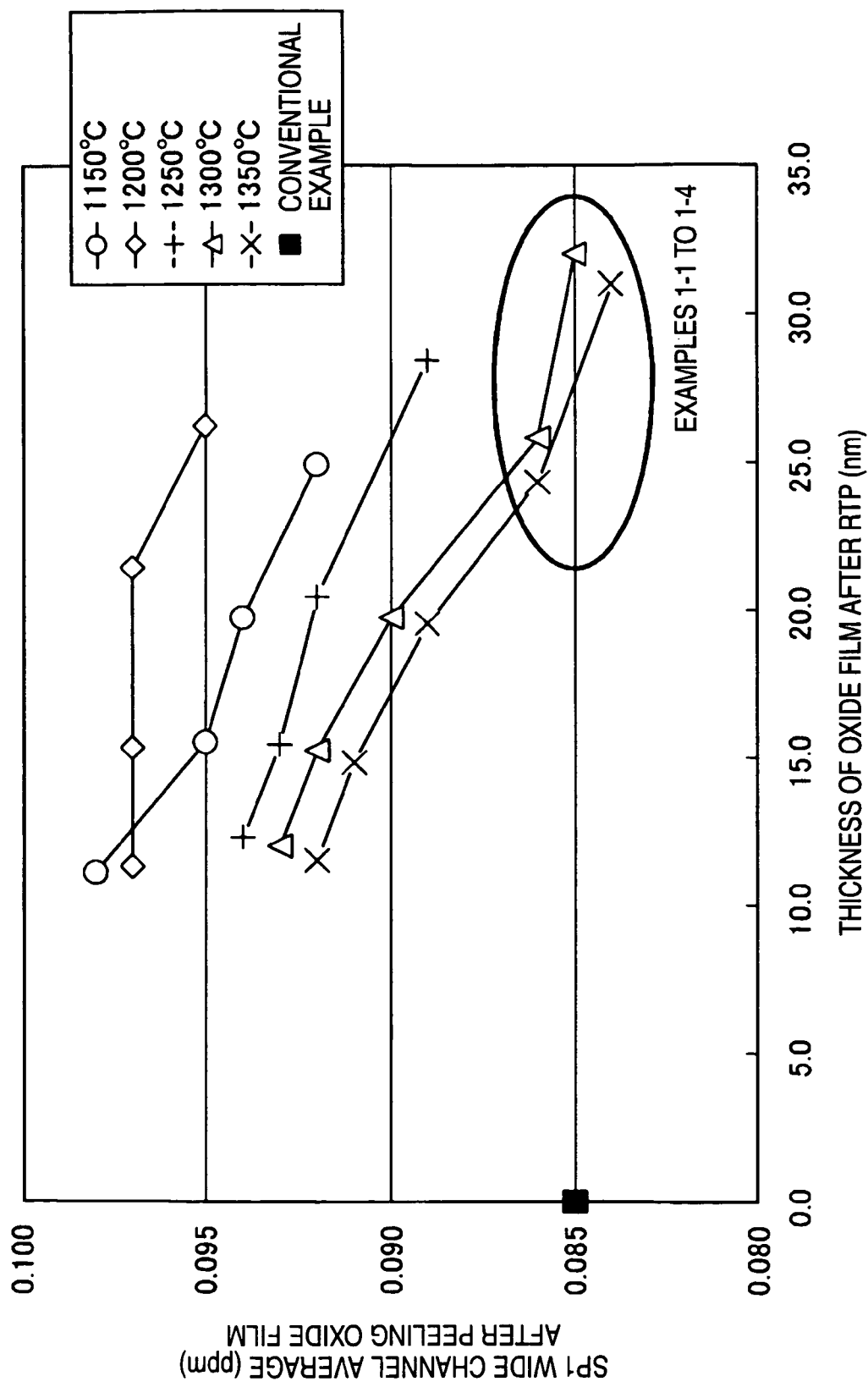
FIG. 4 is a graph showing a relationship between the thickness of the oxide film and a wafer in-plane average value of Haze of SP1 at each ultimate temperature T1 in the test 1-1.
Figure 5:
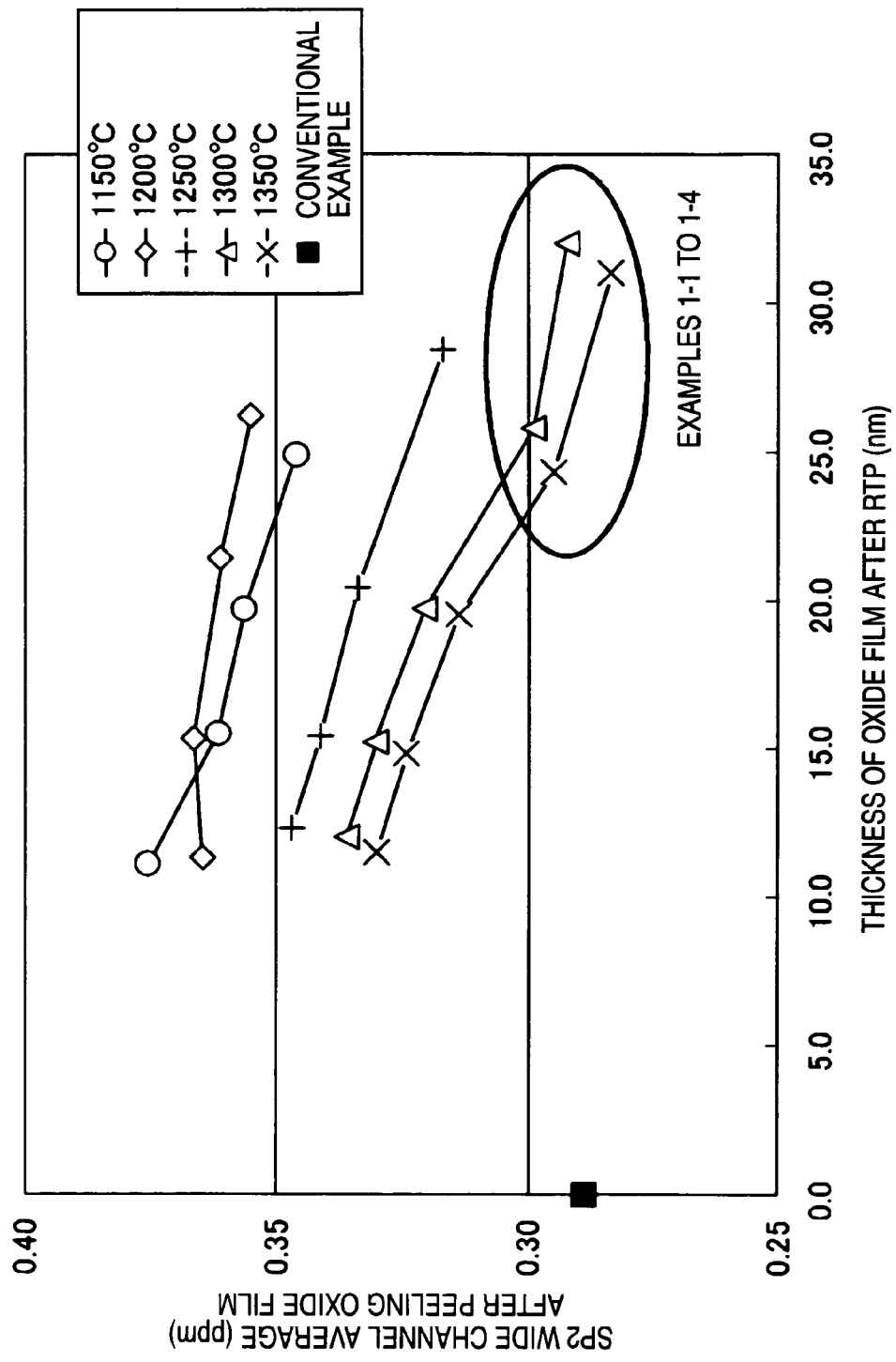
FIG. 5 is a graph showing a relationship between the thickness of the oxide film and a wafer in-plane average value of Haze of SP2 at each ultimate temperature T1 in the test 1-1.

Moreover, FIG. 4 is a graph showing a relationship between the thickness of the oxide film and a wafer in-plane average value of Haze of SP1 at each ultimate temperature $T1$, and FIG. 5 is a graph showing a relationship between the thickness of the oxide film and a wafer in-plane average value of Haze of SP2 at each ultimate temperature $T1$. In both of FIGS. 4 and 5, an axis of ordinate indicates the Haze and an axis of abscissa indicates the thickness of the oxide film.

TABLE 1

|  | Ultimate temperature $T1$ (° C.) | Thickness of oxide film (nm) | Haze average value (ppm) | |
|---|---|---|---|---|
|  |  |  | SP1 | SP2 |
| Comparative example 1-1 | 1150 | 11.1 | 0.098 | 0.37545 |
| Comparative example 1-2 | 1150 | 15.5 | 0.095 | 0.36137 |
| Comparative example 1-3 | 1150 | 19.7 | 0.094 | 0.35621 |
| Comparative example 1-4 | 1150 | 24.9 | 0.092 | 0.34598 |
| Comparative example 1-5 | 1200 | 11.3 | 0.097 | 0.36451 |
| Comparative example 1-6 | 1200 | 15.3 | 0.097 | 0.36631 |
| Comparative example 1-7 | 1200 | 21.4 | 0.097 | 0.36094 |
| Comparative example 1-8 | 1200 | 26.2 | 0.095 | 0.35494 |
| Comparative example 1-9 | 1250 | 12.3 | 0.094 | 0.34689 |
| Comparative example 1-10 | 1250 | 15.4 | 0.093 | 0.34124 |
| Comparative example 1-11 | 1250 | 20.4 | 0.092 | 0.33378 |
| Comparative example 1-12 | 1250 | 28.4 | 0.089 | 0.31689 |
| Comparative example 1-13 | 1300 | 12.0 | 0.093 | 0.33602 |

TABLE 1-continued

| | Ultimate temperature T1 (° C.) | Thickness of oxide film (nm) | Haze average value (ppm) | |
|---|---|---|---|---|
| | | | SP1 | SP2 |
| Comparative example 1-14 | 1300 | 15.2 | 0.092 | 0.33034 |
| Comparative example 1-15 | 1300 | 19.7 | 0.090 | 0.32059 |
| Example 1-1 | 1300 | 25.8 | 0.086 | 0.29885 |
| Example 1-2 | 1300 | 32.0 | 0.085 | 0.29212 |
| Comparative example 1-16 | 1350 | 11.5 | 0.092 | 0.33011 |
| Comparative example 1-17 | 1350 | 14.8 | 0.091 | 0.32423 |
| Comparative example 1-18 | 1350 | 19.5 | 0.089 | 0.31374 |
| Example 1-3 | 1350 | 24.3 | 0.086 | 0.29478 |
| Example 1-4 | 1350 | 31.0 | 0.084 | 0.28332 |
| Conventional example | 1200 | 0 | 0.085 | 0.37545 |

From the results shown in the graphs of FIGS. 4 and 5, it was found that a condition for obtaining the average value of the Haze on the same level as that in the conventional example is satisfied when the ultimate temperature T1 is equal to or higher than 1300° C. and the thickness of the oxide film is equal to or greater than 24.3 nm (examples 1-1 to 1-4).

(Test 1-2) Relationship Between Oxygen Partial Pressure and Oxygen Concentration of Wafer The heat treatment described in the conventional example was carried out over a silicon wafer (a diameter of 300 mm, a thickness of 775 mm and an oxygen concentration of $1.3 \times 10^{18}$ atoms/cc) obtained by slicing a silicon single crystal ingot manufactured by the CZ method and having both sides subjected to mirror polishing, oxygen was diffused outward, the silicon wafer was then introduced into the RTP apparatus shown in FIG. 1, an oxygen partial pressure was varied in an oxygen containing atmosphere diluted with argon (a total gas flow rate of 20 slm), and an ultimate temperature T1 of 1350° C. and a holding time t of 15 seconds at the ultimate temperature T1 were set and the other conditions were set to be the same as those in the test 1-1 to carry out a rapid heating/cooling heat treatment. Thus, an oxygen concentration profile in a depth direction on a center of each anneal wafer was evaluated by a secondary ion mass spectrometer (SIMS; Ims-6f manufactured by Cameca Co., Ltd.).

Moreover, there was also evaluated the oxygen concentration profile in the depth direction on the center of each anneal wafer in the case in which an oxygen 100% atmosphere was set and an oxygen flow rate was varied to carry out the rapid heating/cooling heat treatment.

Referring to the anneal wafer obtained in the conventional example of the test 1-1, furthermore, an oxygen concentration profile was also evaluated on the same conditions.

Figure 6:
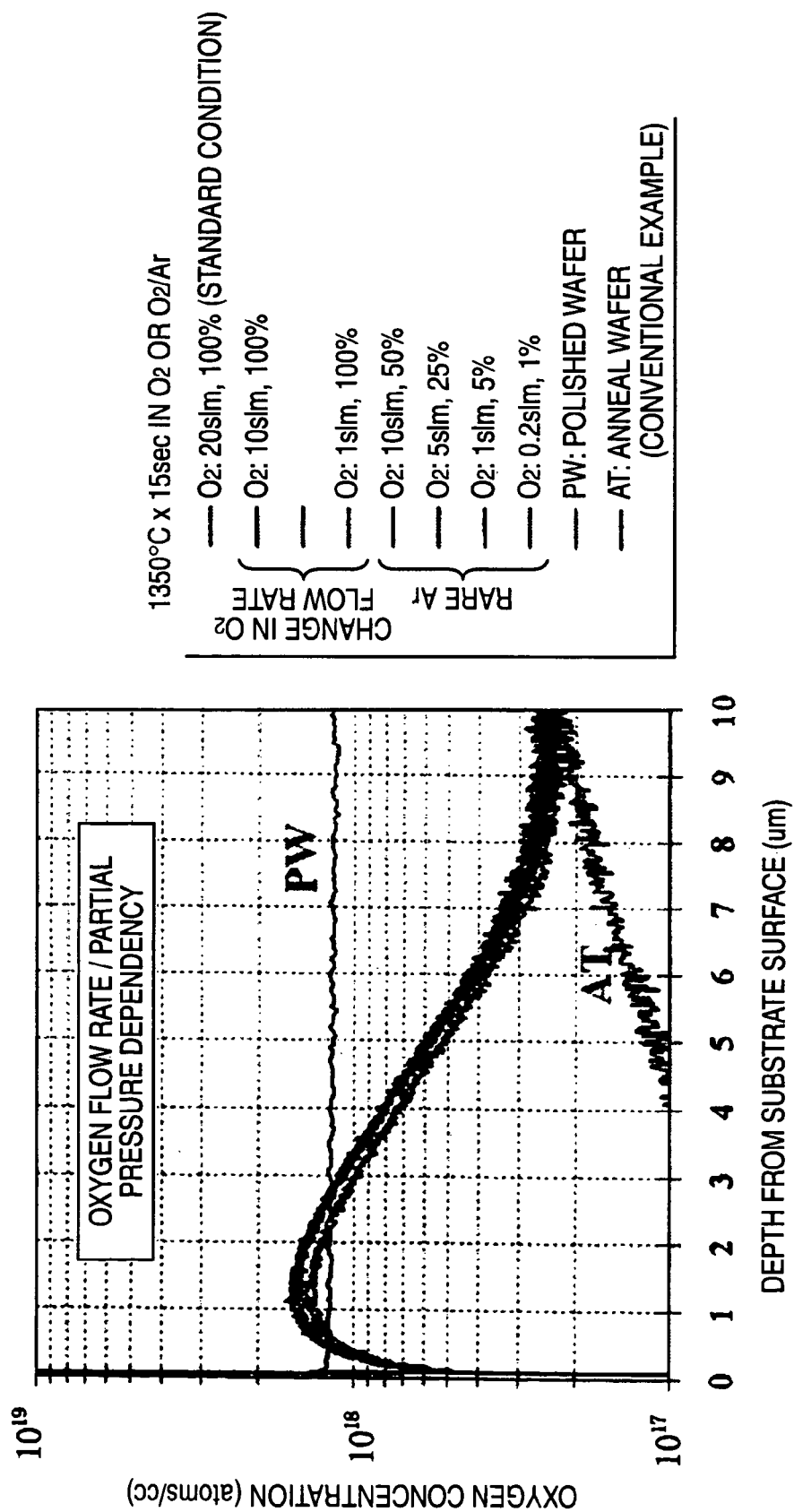
FIG. 6 is a graph showing an oxygen concentration profile in a depth direction on a center of the wafer in a test 1-2.

FIG. 6 is a graph showing the result of the evaluation. An oxygen concentration is a value obtained by an old-ASTM conversion. In FIG. 6, "AT" represents a wafer subjected to only annealing according to the conventional example and "PW" represents an oxygen concentration profile of a wafer which was not subjected to the annealing at all but was obtained after mirror polishing.

From the result shown in the graph of FIG. 6, it was found that oxygen is inward diffused more sufficiently into a surface layer of a wafer subjected to the rapid heating/cooling heat treatment in an oxygen partial pressure 1% atmosphere diluted with an argon gas as compared with a wafer on the other oxygen atmosphere conditions.

However, a sufficient oxygen concentration could not be obtained in case of an oxygen partial pressure of 0.4% (not shown).

Moreover, it was found that the oxygen concentration in the surface layer of the wafer (AT) subjected to only the annealing according to the conventional example is reduced more greatly than the anneal wafer which is further subjected to the rapid heating/cooling heat treatment in the oxygen containing atmosphere as shown in FIG. 6.

(Test 1-3) Relationship Between Ultimate Temperature/Holding Time and Oxygen Concentration of Wafer A silicon wafer (a diameter of 300 mm, a thickness of 775 mm and an oxygen concentration of $1.3 \times 10^{18}$ atoms/cc) obtained by slicing a silicon single crystal ingot manufactured by the CZ method and having both sides subjected to mirror polishing was introduced into the RTP apparatus shown in FIG. 1, an ultimate temperature and a holding time thereof were varied in an oxygen 100% atmosphere (a flow rate of 20 slm) to carry out a rapid heating/cooling heat treatment, and an oxygen concentration profile in a depth direction on a center of each anneal wafer was evaluated by a secondary ion mass spectrometer (SIMS; Ims-6f manufactured by Cameca Co., Ltd.) and a maximum oxygen concentration in a surface layer of the wafer (approximately 1 to 2 μm from a surface) was thus obtained.

Figure 7:
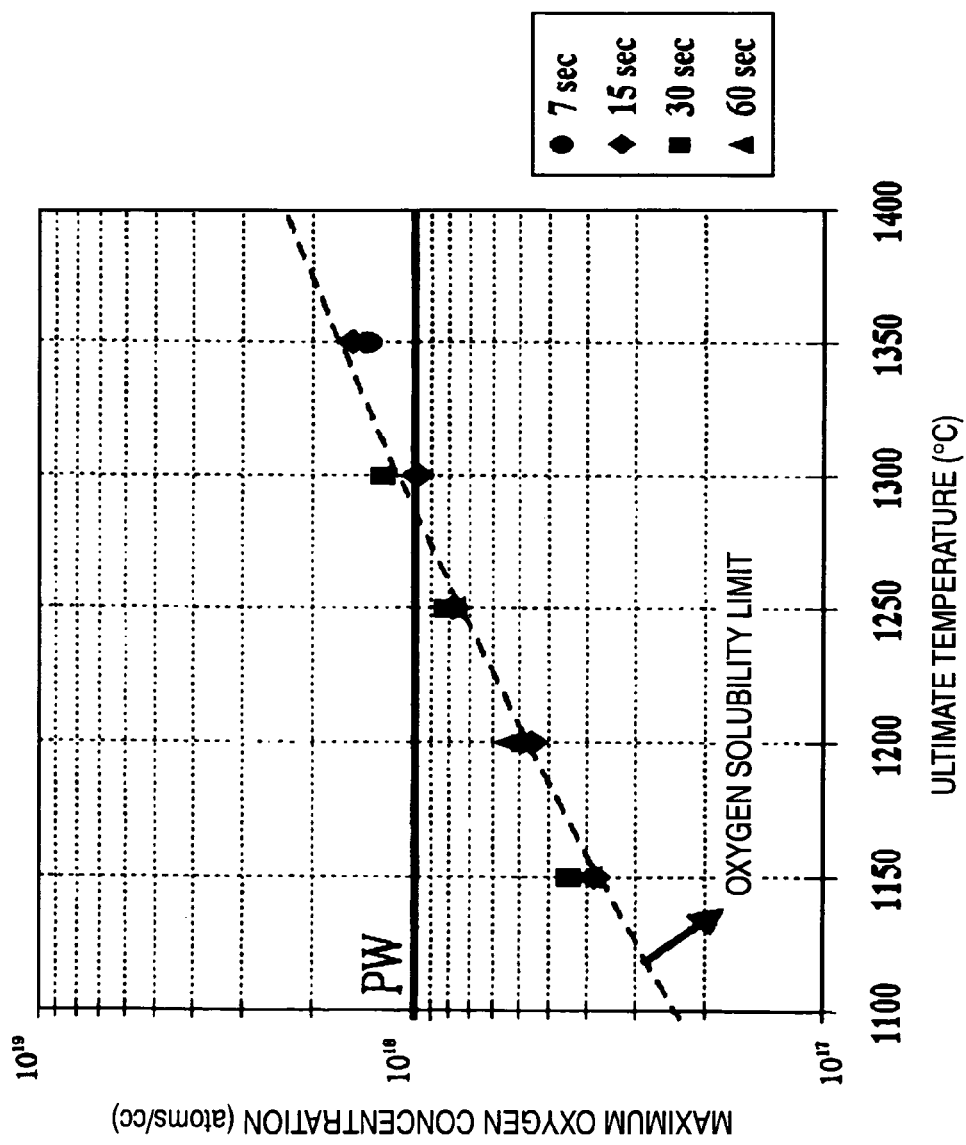
FIG. 7 is a graph showing a relationship between a maximum oxygen concentration in a surface layer of the wafer and an ultimate temperature in a test 1-3.

FIG. 7 is a graph showing a relationship between the maximum oxygen concentration in the surface layer of the wafer and the ultimate temperature.

From the result shown in the graph of FIG. 7, it was found that the maximum oxygen concentration in the surface layer of the anneal wafer is determined by the ultimate temperature without depending on a time required for a treatment.

In case of 1300° C. or more, particularly, the maximum oxygen concentration exceeds that on a polishing substrate (PW). Therefore, it can be estimated that a dislocation suppressing effect is almost equivalent.

From the result, accordingly, it is preferable that the ultimate temperature of the rapid heating/cooling heat treatment should be set to be equal to or higher than 1300° C. from a viewpoint of a suppression of a reduction in the oxygen concentration.

Second Embodiment

A second embodiment according to the invention will be described below in more detail with reference to the drawings.

Also in a method of heat treating a silicon wafer according to the second embodiment, a quick heating and quick cooing heat treatment is carried out over a wafer obtained by slicing a silicon single crystal ingot manufactured by the CZ method in the same manner as in the first embodiment. The second embodiment is characterized in that the rapid heating/cooling heat treatment is carried out in an oxygen containing atmosphere at an ultimate temperature which is equal to or higher than 1200° C. and is equal to or lower than a melting point of silicon, and an oxide film having a thickness of 9.1 nm or less is thus formed on a surface of the wafer.

The rapid heating/cooling heat treatment is carried out, in an oxygen containing atmosphere by using a rapid heating/cooling thermal process apparatus (hereinafter referred to as an RTP apparatus), over a silicon wafer which is obtained by the same processing as that in the first embodiment and is subjected to mirror polishing, and an oxide film having a thickness of 9.1 nm or less is thus formed on a surface of the wafer.

Since the RTP apparatus to be used for the method of heat treating a silicon wafer according to the second embodiment is the same as the RTP apparatus 10 according, to the first embodiment, description thereof will be omitted.

In the rapid heating/cooling heat treatment, it is difficult to suppress a deterioration in a roughness of the surface of the wafer when the thickness of the oxide film formed on the surface of the wafer exceeds 9.1 nm.

It is preferable that a lower limit of the thickness of the oxide film should be equal to or greater than 3.0 nm. If the thickness is smaller than 3.0 nm, it is difficult to inward diffuse oxygen in the oxygen containing atmosphere into the wafer, thereby enhancing an oxygen concentration of a surface layer of the wafer sufficiently.

In the second embodiment, moreover, it is preferable that an ultimate temperature in the rapid heating/cooling heat treatment should be equal to or higher than 1200° C. and should be equal to or lower than a melting point of silicon.

By setting the temperature condition, it is possible to suppress a deterioration in a roughness of the surface of the wafer in the rapid heating/cooling heat treatment more greatly. When the ultimate temperature exceeds the melting point of the silicon, the silicon wafer which is to be subjected to the rapid heating/cooling heat treatment is molten, which is not preferable.

It is more preferable that the ultimate temperature should be equal to or higher than 1300° C. and should be equal to or lower than the melting point of the silicon.

By setting the temperature condition, the oxygen concentration in the surface layer of the wafer can be set into an equal level to a wafer which has not been heat treated. Therefore, it is possible to suppress an occurrence of a dislocation in a semiconductor device process more greatly.

It is more preferable that an upper limit of the ultimate temperature should be equal to or lower than 1380° C. from a viewpoint of a lifetime of the RTP apparatus.

Since a relationship between a temperature and a time in a heat treating sequence in the rapid heating/cooling heat treatment according to the second embodiment is the same as that in the first embodiment, description thereof will be omitted.

In the same manner as in the first embodiment, it is preferable that an oxygen partial pressure in the oxygen containing atmosphere according to the second embodiment should be equal to or higher than 1.0% and should be equal to or lower than 20%.

In the same manner as in the first embodiment, moreover, it is preferable that a gas other than an oxygen gas in the oxygen containing atmosphere according to the second embodiment should be an inert gas.

In the same manner as in the first embodiment, it is particularly preferable that an argon gas should be used as the inert gas.

In the same manner as in the first embodiment, it is preferable that both the temperature rising speed $\Delta Tu$ and the temperature falling speed $\Delta Td$ according to the second embodiment should be equal to or higher than 10° C./second and should be equal to or lower than 150° C./second.

The ultimate temperature $T1$ according to the second embodiment is equal to or higher than 1200° C. and is equal to or lower than the melting point of the silicon, is preferably equal to or higher than 1300° C. and equal to or lower than the melting point of the silicon, and is more preferably equal to or higher than 1300° C. and equal to or lower than 1380° C. as described above.

In the same manner as in the first embodiment, it is preferable that a holding time t at the ultimate temperature $T1$ according to the second embodiment should be equal to or longer than one second and should be equal to or shorter than 60 seconds.

EXAMPLE 2

More specific description will be given to the second embodiment based on an example 2 and the invention is not restricted to the following example 2.

(Test 2-1) Relationship Among Ultimate Temperature, Thickness of Oxide Film and Surface Roughness In the same manner as in Test 1-1, a silicon wafer (a diameter of 300 mm, a thickness of 775 mm and an oxygen concentration of $1.3 \times 10^{18}$ atoms/cc) obtained by slicing a silicon single crystal ingot manufactured by the CZ method and having both sides subjected to mirror polishing was introduced into the RTP apparatus shown in FIG. 1, and an ultimate temperature $T1$ and a holding time t thereof were varied in an oxygen 100% atmosphere (a flow rate of 20 slm) at a temperature $T0$ of 500° C., and a temperature rising speed $\Delta Tu$ and a temperature falling speed $\Delta Td$ of 50° C./second so that a rapid heating/cooling heat treatment was carried out in the heat treating sequence shown in FIG. 2. Consequently, there was obtained an anneal wafer in which a thickness of an oxide film formed on a surface of the wafer is varied.

The thickness of the oxide film formed on the surface of each anneal wafer thus obtained was measured through AutoELIII by an ellipsometry method. In the same manner as in the example 1, the measurement was carried out on nine points in total which include a wafer center O (a distance of 0 mm from a center) and two points for each of positions having distances of 40 mm, 75 mm, 110 mm and 145 mm in both directions from the center of the wafer to a circumference of the wafer as shown in FIG. 3. Their average value was set to be the thickness of the film. Numeric values in FIG. 3 represent the distance from the center of the wafer.

Moreover, the oxide film was removed by fluoric acid cleaning and a wafer in-plane average value of a surface roughness (Haze) was then measured by laser beam scattering type particle counters SP1 and SP2.

In the same manner as in the first embodiment, for comparison, as the conventional example, the rapid heating/cooling heat treatment was not carried out over the same silicon wafer as described above but a heat treatment was performed by using a well-known vertical heat treating furnace in an argon 100% atmosphere at a temperature $T0$ of 500° C., a temperature rising speed $\Delta Tu$ and a temperature falling speed $\Delta Td$ of 3° C./minute, an ultimate temperature $T1$ of 1200° C. and a holding time t of one hour at the ultimate temperature $T1$, and a thickness of an oxide film and a wafer in-plane average value of the Haze were measured in the same manner as described above.

Table 2 shows a result of the measurement for the thickness of the oxide film and the wafer in-plane average value of the Haze at each ultimate temperature $T1$ according to the second embodiment.

Figure 8:
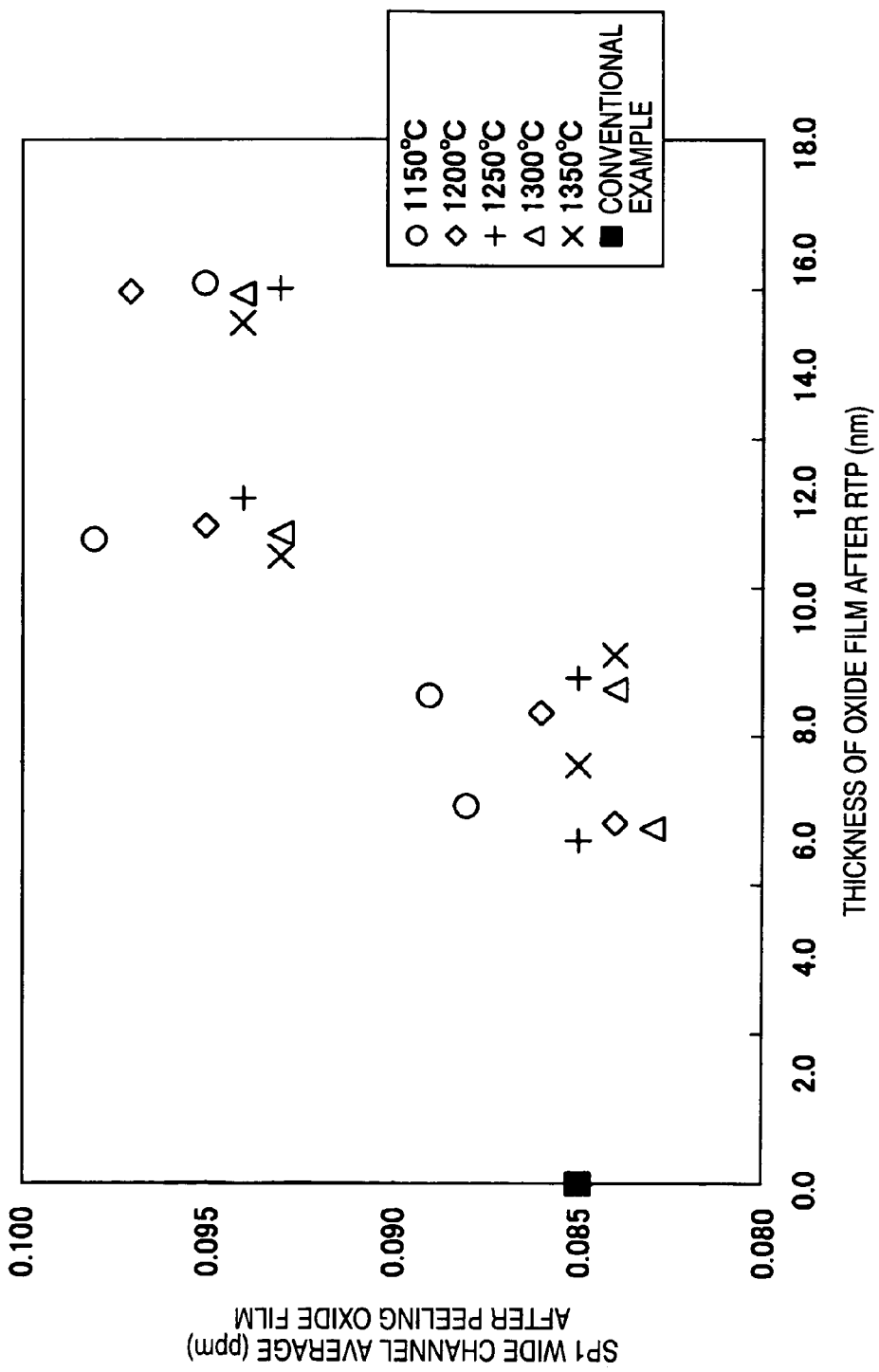
FIG. 8 is a graph showing a relationship between the thickness of the oxide film and the wafer in-plane average value of the Haze of SP1 at each ultimate temperature T1 in a test 2-1.

Moreover, FIG. 8 is a graph showing a relationship between the thickness of the oxide film and a wafer in-plane average value of Haze of SP1 at each ultimate temperature $T1$ according to the second embodiment, and FIG. 9 is a graph showing a relationship between the thickness of the oxide film and a wafer in-plane average value of Haze of SP2 at each ultimate temperature $T1$ according to the second embodiment. In both of FIGS. 8 and 9, an axis of ordinate indicates the Haze and an axis of abscissa indicates the thickness of the oxide film.

TABLE 2

| | Ultimate temperature T1 (° C.) | Thickness of oxide film (nm) | Haze average value (ppm) SP1 | Haze average value (ppm) SP2 |
|---|---|---|---|---|
| Example 2-1 | 1150 | 6.5 | 0.088 | 0.31212 |
| Example 2-2 | 1150 | 8.4 | 0.089 | 0.32293 |
| Comparative example 2-1 | 1150 | 11.1 | 0.098 | 0.37545 |
| Comparative example 2-2 | 1150 | 15.5 | 0.095 | 0.36137 |
| Example 2-3 | 1200 | 6.2 | 0.084 | 0.28821 |
| Example 2-4 | 1200 | 8.1 | 0.086 | 0.29723 |
| Comparative example 2-3 | 1200 | 11.3 | 0.095 | 0.33291 |
| Comparative example 2-4 | 1200 | 15.3 | 0.097 | 0.36631 |
| Example 2-5 | 1250 | 5.9 | 0.085 | 0.28951 |
| Example 2-6 | 1250 | 8.7 | 0.085 | 0.29113 |
| Comparative example 2-5 | 1250 | 11.8 | 0.094 | 0.33145 |
| Comparative example 2-6 | 1250 | 15.4 | 0.093 | 0.33854 |
| Example 2-7 | 1300 | 6.1 | 0.083 | 0.28582 |
| Example 2-8 | 1300 | 8.5 | 0.084 | 0.28942 |
| Comparative example 2-7 | 1300 | 11.2 | 0.093 | 0.33011 |
| Comparative example 2-8 | 1300 | 15.3 | 0.094 | 0.34434 |
| Example 2-9 | 1350 | 7.2 | 0.085 | 0.28872 |
| Example 2-10 | 1350 | 9.1 | 0.084 | 0.28832 |
| Comparative example 2-9 | 1350 | 10.8 | 0.093 | 0.32884 |
| Comparative example 2-10 | 1350 | 14.8 | 0.094 | 0.34323 |
| Conventional example | 1200 | 0 | 0.085 | 0.28873 |

From the results shown in the graphs of FIGS. 8 and 9, it was found that the condition for obtaining the average value of the Haze having an equal level to that in the conventional example is satisfied when the thickness of the oxide film is equal to or smaller than 9.1 nm (examples 2-1 to 2-10), and preferably, when the ultimate temperature T1 is equal to or higher than 1200° C. and the thickness of the oxide film is equal to or smaller than 9.1 nm (examples 2-3 to 2-10).

While the present inventive concept has been shown and described with reference to certain exemplary embodiments thereof, it will be understood by those skilled in the art that various changes in form and details may be made therein without departing from the spirit and scope of the invention as defined by the appended claims.

FIG. 1
A: Gas
B: Exhaust
FIG. 2
Second
Second
Second
Time (second)
FIG. 4
A: SP1 after peeling oxide film
B: Conventional example
C: Examples 1-1 to 1-4
D: Thickness of oxide film after RTP
FIG. 5
A: SP2 after peeling oxide film
B: Conventional example
C: Examples 1-1 to 1-4
D: Thickness of oxide film after RTP
FIG. 6
A: Oxygen concentration
B: Oxygen flow rate/partial pressure dependency
C: Depth from substrate surface
D: Rare Ar
E: Change in $O_2$ flow rate
F: Standard condition
G: Polished wafer
H: Anneal wafer (conventional example)
FIG. 7
A: Maximum oxygen concentration
B: Oxygen solubility limit
C: Ultimate temperature
FIG. 8
A: SP1 after peeling oxide film
B: Conventional example
C: Thickness of oxide film after RTP
FIG. 9
A: SP2 after peeling oxide film
B: Conventional example
C: Thickness of oxide film after RTP

What is claimed is:

1. A method of heat treating a silicon wafer, said method comprising:
    carrying out a rapid heating/cooling heat treatment for fanning an oxide film having a thickness of 5.9 nm or more and 9.1 nm or less on a surface of the silicon wafer in an oxygen containing atmosphere,
    wherein an ultimate temperature in the rapid heating/cooling heat treatment is set to be equal to or higher than 1300° C. and to be equal to or lower than a melting point of silicon.

2. The method according to claim 1, the silicon wafer is obtained by slicing a silicon single crystal ingot manufactured by Czochralski method.

3. The method according to claim 1, wherein the ultimate temperature in the rapid heating/cooling heat treatment is set to be equal to or higher than 1300° C. and to be equal to or lower than 1380° C.

4. The method according to claim 1, wherein an oxygen partial pressure is set to be equal to or higher than 1.0% and to be equal to or lower than 20% in the oxygen containing atmosphere.

5. The method according to claim 1, wherein the oxygen containing atmosphere is constituted by argon and oxygen.

6. The method according to claim 1, wherein a holding time at the ultimate temperature is set to be equal to or longer than one second and to be equal to or shorter than 60 seconds.

7. The method according to claim 1, wherein a temperature rising speed in the rapid heating/cooling heat treatment is set to be equal to or higher than 10° C./second and to be equal to or lower than 150° C./second.

8. The method according to claim 1, wherein a temperature falling speed in the rapid heating/cooling heat treatment is set to be equal to or higher than 10° C./second and to be equal to or lower than 150° C./second.

* * * * *